Figure 1:
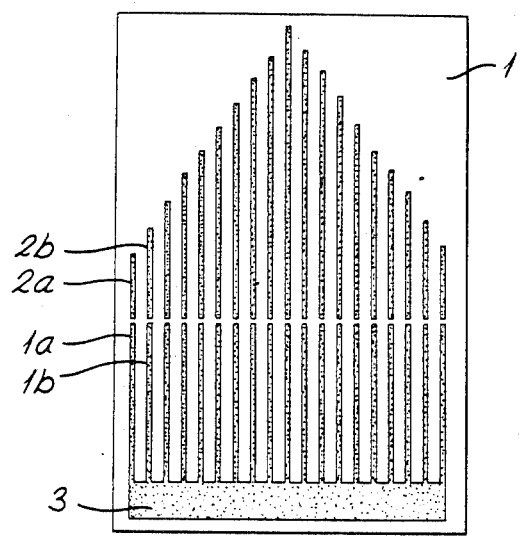

ial on which there are positioned pairs of electrodes $1a$,
United States Patent [19]

Margulis et al.

[11] Patent Number: 4,693,599

[45] Date of Patent: Sep. 15, 1987

[54] APPARATUS FOR MEASURING LIGHT BEAM CHARACTERISTICS

[75] Inventors: Walter Margulis, London; Wilson Sibbett, Hillingdon Heath; William E. Sleat, Ickenham, all of England

[73] Assignee: National Research Development Corporation, London, England

[21] Appl. No.: 837,644

[22] Filed: Mar. 5, 1986

Related U.S. Application Data

[63] Continuation of Ser. No. 554,392, Nov. 22, 1983, abandoned.

[30] Foreign Application Priority Data

Nov. 26, 1982 [GB] United Kingdom ............... 8233812

[51] Int. Cl.$^4$ .......................... G01J 1/42; H01L 27/14
[52] U.S. Cl. .................................... 356/121; 250/578; 357/30
[58] Field of Search ............... 356/121; 250/211 J, 250/578; 357/30, 68, 30 D, 30 H

[56] References Cited

U.S. PATENT DOCUMENTS 4,162,507  7/1979  Fischer ........................ 357/30 X
4,320,462  3/1982  Lund et al. .................... 356/121

FOREIGN PATENT DOCUMENTS 0026663   4/1981  European Pat. Off. .
  74407   6/1980  Japan ........................... 356/121
 879949  10/1961  United Kingdom .
1087917  10/1967  United Kingdom .
1144488   3/1969  United Kingdom .
2051477   1/1981  United Kingdom .
2128019   4/1984  United Kingdom .

Primary Examiner—F. L. Evans
Attorney, Agent, or Firm—Cushman, Darby & Cushman

[57] ABSTRACT

The spatial or temporal characteristic of a beam of light or other electromagnetic radiation or a beam of subatomic particles is measured by an array of detectors. The array comprises the layer 1 of photosensitive material on which there are positioned pairs of electrodes $1a$, $2a$ and $1b$, $2b$ etc., with gaps between the electrodes of a pair. The gaps are spaced apart linearly and the material is chosen so that incident light affects current flow between the electrodes defining a gap. Changes in current flow between the individual pairs of electrodes are measured. For measurement of spatial profile layer 1 has a resistivity which varies linearly with the amplitude of incident light. For measurement of temporal profile the beam is split with the split beams being directed on to the array with different angles of incidence and the material is chosen to have a two-photon conductivity.

9 Claims, 10 Drawing Figures

APPARATUS FOR MEASURING LIGHT BEAM CHARACTERISTICS

This is a continuation of application Ser. No. 554,392 filed Nov. 22, 1983 which was abandoned upon the filing hereof.

This invention relates to apparatus for measuring the characteristics of light beams. It has particular application in the measurement of certain characteristics of laser beams. The characteristic may be the spatial characteristic of a beam, that is to say its cross-sectional profile. Alternatively, the characteristic may be the temporal characteristic of a pulsed beam, that is to say its duration and shape in the time domain.

According to the invention apparatus for measuring a characteristic of a beam of light comprises:

a layer of photosensitive semiconductor or insulating material and a plurality of electrodes on the layer the electrodes being positioned to define gaps between pairs of electrodes, the material in the gaps acting as an array of light detectors;

means for directing a beam a characteristic of which is to be measured onto said array;

means for detecting changes in an electrical characteristic of each of said detectors caused by incidence of the light beam on the array; and means for indicating such changes.

Preferably the said layer is a layer of semiconductor material of high resistivity and ohmic contacts are established at the electrodes. The layer may comprise a substrate supporting the electrodes or else may be a film deposited on an insulating substrate.

It is preferred that the electrical characteristic which is detected is changes in the flow of electrical current between the pairs of electrodes.

In carrying out the invention the pairs of electrodes are preferably spaced apart rectilinearly along the array. One electrode of each pair may be connected to a common terminal and the other electrodes of each pair are connected to their own individual terminals. Where the characteristic to be measured is a spatial characteristic of the intensity profile across a beam the semiconductor material is preferably chosen so that the electrical characteristic being detected is linearly related to the intensity of light. A suitable material for such purpose is near intrinsic crystalline silicon.

Where the characteristic being measured is a temporal characteristic of the change in intensity of a pulsed beam with time means may be provided for splitting the beam and for directing the two component beams onto an array at chosen angles of incidence. One of these angles may be normal to the plane of the array.

For the measurement of temporal characteristics the semiconductor material is preferably selected so that the change in current flow with incident light is non-linearly related to the intensity of the beam. Preferably the material has a 2-photon conductivity and suitable materials, depending on the frequency of the light beam, are gallium phosphide and zinc sulphide.

Figure 3:
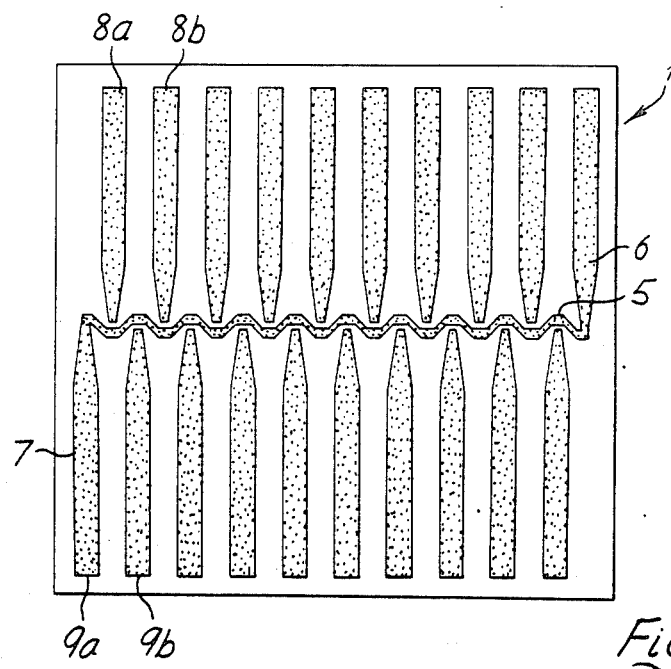
Figure 2:
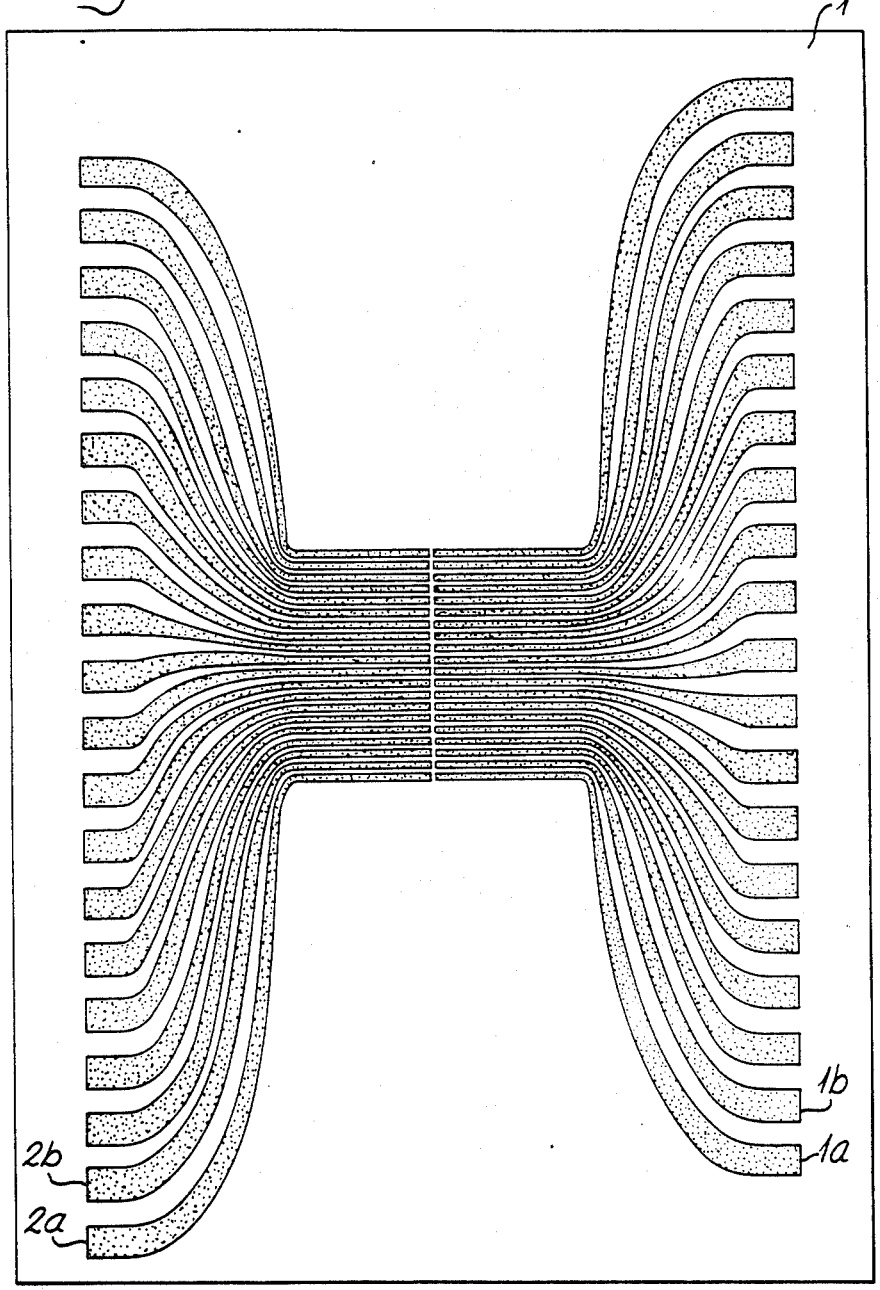
Figure 4:
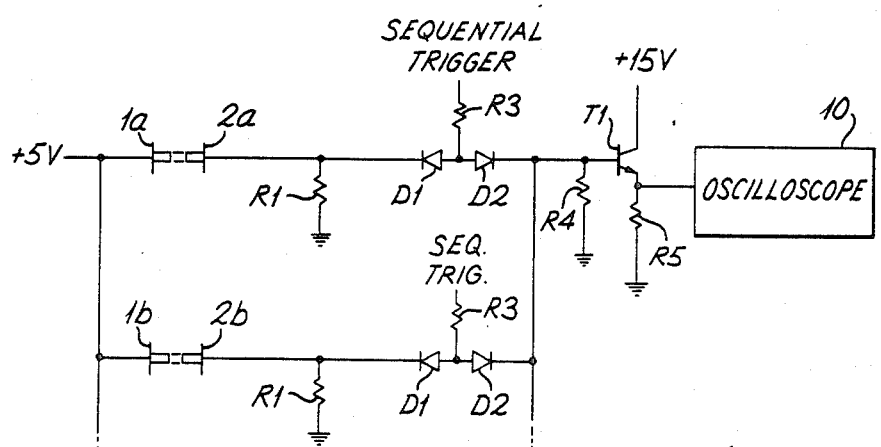
Figure 5:
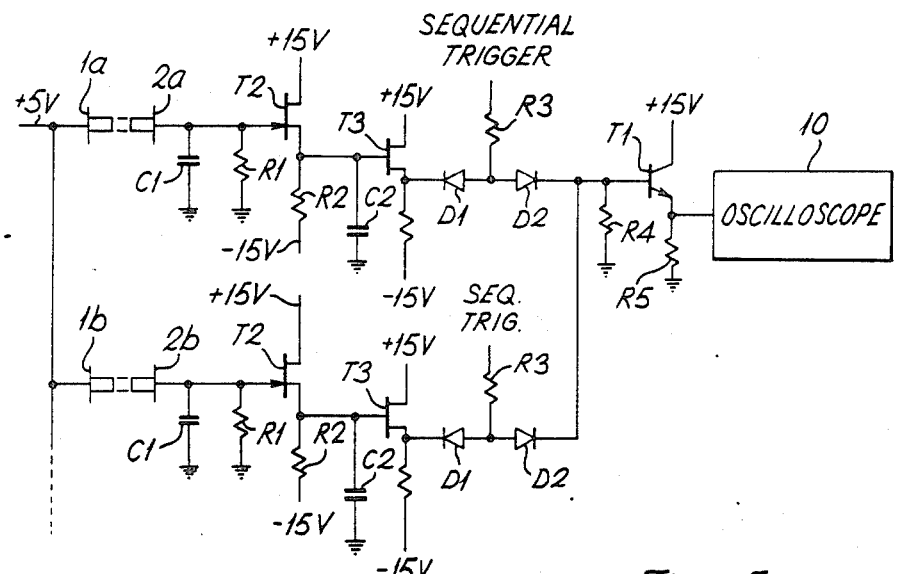
Figure 6:
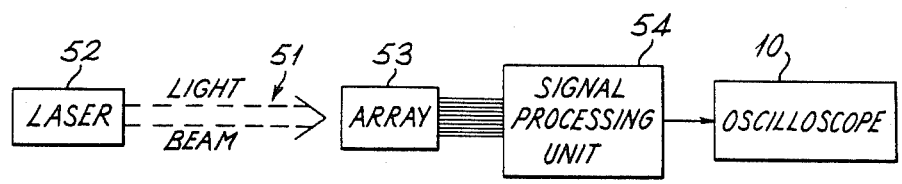
Figure 7A:
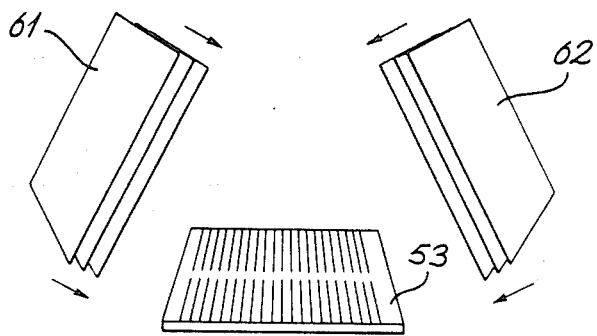
Figure 7B:
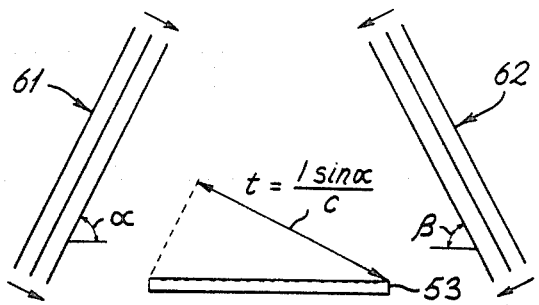
Figure 8:
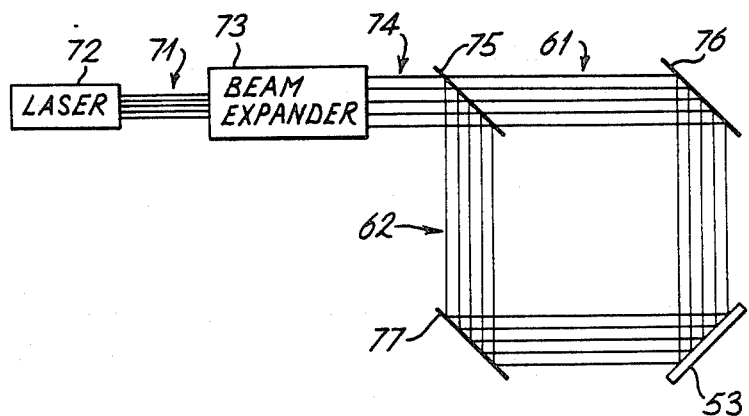
Figure 9:
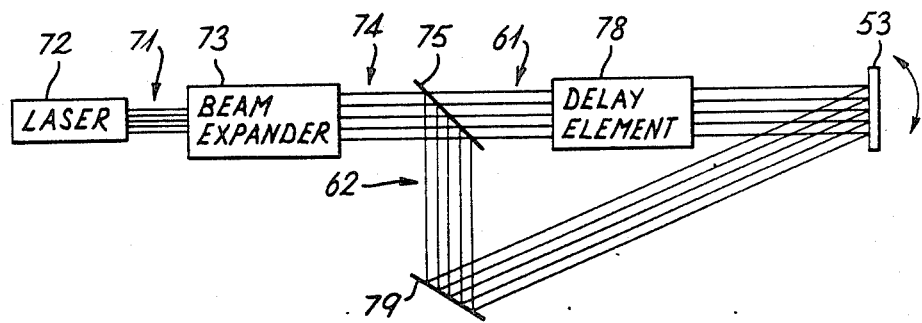

In order that the invention may be more fully understood reference will now be made to the accompanying drawings in which;

FIG. 1, FIG. 2 and FIG. 3 illustrate detector arrays with alternative electrode configurations, FIG. 4 shows a circuit for use in measurement of spatial characteristics, FIG. 5 shows a circuit for use in measurement of temporal characteristics, FIG. 6 shows an optical arrangement for measuring spatial characteristics, FIG. 7a and FIG. 7b show in perspective and in side view the incidence of split beams for measurement of temporal characteristics, and FIG. 8 and FIG. 9 show alternative optical arrangements for measuring temporal characteristics.

Referring now to FIG. 1 there is shown therein an array of light detectors. The array comprises a substrate 1 of a suitable photosensitive semiconductor material on which is formed an electrode pattern. The pattern comprises a first row of finger-like electrodes 1a, 1b etc. which are positioned facing a second row of similarly shaped electrodes 2a, 2b etc. so that gaps are formed between pairs of electrodes 1a, 2a and 1b, 2b etc. The gaps all lie along a straight line extending across substrate 1. All the rows of electrodes 1a, 1b etc. are connected to a common strip 3 to which an external input connection is made.

The electrodes 2a, 2b etc. are not connected to each other but are kept separate and are terminated at their ends remote from the gaps in diverging fashion to facilitate individual external output connections being made to the ends of these electrodes.

FIG. 2 shows a modification of the electrode pattern of FIG. 1 and like parts have like reference numerals. In FIG. 2 it will be seen that the electrodes 1a, 1b etc. are not connected to a common strip but have individual external connections. Additionally, in the FIG. 2 arrangement in order to facilitate external connections to each individual electrode the ends of the electrodes are spaced apart over a much wider distance than the length of the row of gaps between the electrodes.

FIG. 3 shows an alternative pattern of electrodes that can be used. The semiconductor substrate 1 is as in FIG. 1 or FIG. 2 but the pattern of electrodes comprises an input electrode in the form of a horizontal wavy line 5 the ends of which are connected to strips 6 and 7 to facilitate external connection. Line 5 forms a common input electrode of the array. The individual output electrodes comprise a row of strips 8a, 8b etc. and a row of strips 9a, 9b etc. positioned respectively above and below line 5. The rows of strips are offset with respect to each other and there is a gap between each strip and the input line 5 and all the gaps lie along a straight line. To facilitate formation of the electrode pattern strip 6 can be one of the series 8a, 8b etc. and strip 7 can be one of the series 9a, 9b etc. except that it is only the strips 6 and 7 that are directly connected to line 5. The electrode patterns shown in FIG. 1 and FIG. 2 and FIG. 3 are only some possible examples of suitable electrode patterns.

The technique for fabricating a light detector such as shown in FIGS. 1, 2 or 3 similar to that used in integrated circuitry. One method is to cover the semiconductor material with an evaporated layer of aluminium or other suitable electrically conductive material and then shape the electrodes using photolithographic techniques. Another possibility is to prepare the electrodes directly by masking. The greater the number of electrode pairs that can be provided in a given length across the substrate the greater will be the resolution of the device. Typically 20–100 electrode pairs can be provided per cm but greater integration is possible.

The photosensitive material selected for the semiconductor substrate is chosen in accordance with the application and the wavelength of the laser employed. If the array is manufactured to measure a spatial beam profile then the semiconductor should be chosen so that when the array is illuminated by the beam the current across the electrode gaps is preferably proportional to the intensity of the light input. This usually requires that the energy of the photons exceeds the energy gap of the semiconductor so that a single photon produces an electron-hole pair. A typical example of semiconductor for this purpose is nearly intrinsic crystalline silicon. This material can be employed to monitor the spatial beam profile of laser beams in the ultra-violet, visible and near infra-red regions of the spectrum.

For the measurement of the temporal profile of a laser beam the semiconductor should be selected to provide an electrical current across the gaps which is proportional to the square or to any power of the intensity of the laser beam different from unity. For dye lasers of wavelength greater than 0.53 $\mu$m and neodymium lasers of wavelength of 1.06 $\mu$m for example, the semiconductor substrate can comprise gallium phosphide or zinc sulphide.

The nature of the readout circuitry which is connected to the array depends on the recombination time of the photo-induced carriers in the semiconductor material of the array and the duration of the incident light beam. In the case where the recombination time is long compared to the period of the readout cycle, then no electrical storage circuit facility is required for the display of either spatial profiles or temporal profiles. Also, when the semiconductor exhibits a fast recombination time, no electrical storage is needed provided that only the spatial profile of d.c. beams or those having durations exceeding the readout period are to be measured. An appropriate circuit that would be connected to the array where no electrical storage facilities are required is schematically shown in FIG. 4. In this circuit the common input connection to the input electrodes $1a$, $1b$ etc. of the array is supplied with a d.c. bias voltage of say $+5$ V. The separate output electrodes $2a$, $2b$ etc. are each connected to individual resistors R1 which are earthed so that any current flowing between a pair of electrodes appears as a voltage across the associated resistor R1. Pairs of back-to-back diodes D1 and D2 are each connected to resistor R1 and to the base electrode of a single output transistor T1 the collector electrode of which is supplied with a suitable operating voltage of say $+15$ V and the emitter electrode of which is earthed through a load resistor R5. The emitter electrode of transistor T1 can be connected to a suitable indicating instrument, for example an oscilloscope 10. Each pair of electrodes of the electrode array has its own resistor R1 and pairs of back-to-back diodes which are connected to the single output transistor T1.

In the circuit thus far described any voltage across any one of the resistors R1 will not be transferred to the base electrode of transistor T1 because of the presence of the back-to-back diodes. In order to enable the voltages across the resistors R1 to be read trigger pulses are applied in cyclic sequence to the junctions between each pair of back-to-back diodes through individual resistors R3. The sequential trigger pulses may be supplied from a cyclic counter or like device.

A semiconductor having a fast recombination time can also be used in the measurement of the spatial or temporal profiles of pulsed laser beams having durations shorter than or comparable to the period of the readout cycle. However in this instance some means of storing the charge that flows across each electrode gap should be provided in the circuit and such an arrangement is shown in FIG. 5.

Referring now to FIG. 5 there is shown therein a circuit in which like parts have like reference numerals to FIG. 4. However, in the FIG. 5 circuit additional components are associated with each pair of electrodes in order to store the very short duration signals that are generated. Thus a capacitor C1 is connected across each resistor R1 and the voltage across the parallel combination of C1 and R1 is applied to the gate electrode of a field effect transistor T2. The source electrode of transistor T2 is connected to a suitable operating potential and a load resistor R2 is connected to its drain electrode which is also connected to the gate electrode of a second field effect transistor T3. A capacitor C2 is connected between the gate electrode of T3 and earth. The drain electrode of T3 is connected to a pair of back-to-back diodes D1 and D2. The field effect transistor T2 limits the flow of current into capacitor C1 during the readout phase. Because of its high input impedance it prevents discharge of capacitor C1 and thus isolates the storage components from the reading components.

With the arrangement shown in FIG. 5 current flow between any pair of electrodes caused by instantaneous illumination of the electrode array will enable each capacitor C1 to be charged up and reach a voltage determined by the total number of free carriers created by the light beam. This voltage will be transferred through transistor T2 to charge up capacitor C2 without drawing current from capacitor C1. The voltage of capacitor C2 will be held for a sufficient length of time after the termination of the light pulse for a cyclic reading operation of the charges on all capacitors C2 to be carried out by applying sequential trigger pulses to each pair of back-to-back diodes D1 and D2 in a similar manner to that described with reference to FIG. 4. By providing two charge storage circuits comprising capacitors C1 and C2 in cascade the time constant and magnitude of charge on the first storage circuit can be made considerably less than that on the second storage circuit thus permitting a relatively slow reading cycle of the electrode without loss of signal.

Alternative processing circuits to the charge storage circuit shown in FIG. 5 may be used. For example the signals from the electrodes may be differentially amplified or may be digitised and fed into a shift register circuit. In addition, known techniques for substracting the noise components of the signals may be utilised.

In operation of the device with either the circuit of FIG. 4 or 5 as a spatial beam profile detector a beam of light is directed on to the array of electrodes resulting in currents flowing through each pair of electrodes which are proportional to the intensity of the light falling on the gap between the electrodes. These currents are translated into individual voltages across the associated resistors R1 and these voltages are read in sequence by means of the sequential trigger pulses. Thus at the output terminal of transistor T1 there will appear a time sequence of voltages of different value in synchronism with the trigger pulses each of which voltages represents the current flow through the associated electrode gap and hence the intensity of that point of the laser beam falling on the array. This time sequence of voltages can be displayed directly on an oscilloscope to provide a trace representing the variation in intensity of a light beam along the line of the gaps in the electrode array.

The beam being measured is directed to fall at an angle of incidence normal to the array but if desired and provided that the beam has a relatively low divergence the resolution of the detector can be increased by arranging for the light to be incident at an angle other than parallel to the normal. For example if the light beam is incident at an angle of 45° the resolution is increased by a factor of $\sqrt{2}$. However, in this case the apparent total length of the array is reduced by the same factor.

A schematic diagram of an arrangement for the measurement of the spatial beam profile is shown in FIG. 6. The light beam 51 from a laser 52 is directed on to the array 53 of photoconductive elements in air, or any other convenient media (vacuum, fibre optics, etc.). Array 53 may take the form described with reference to FIG. 1, FIG. 2 or FIG. 3 or may have any other suitable electrode configuration. The signals generated are then read sequentially in a signal processing unit 54 corresponding to the circuit shown in FIG. 4 or FIG. 5 and the output is displayed on oscilloscope 10.

For measurement of a temporal beam profile it is necessary to split the beam and direct the two split beams simultaneously on to an array. In this case the semiconductor of the array is selected so that it provides a current output proportional to the square or any power different from unity of the intensity of the incident beams. The incidence of two split beams on to a single array is illustrated diagrammatically in FIG. 7a and 7b. The two beams 61 and 62 arrive from directions on opposite sides of the normal to the plane of the array 53 with angles to the normal of $\alpha$ and $\beta$ respectively. For a beam at an angle $\alpha$ to the normal the time t for the beam to scan across the array will be given by $t = 1 \cdot \sin\alpha / c$, where 1 is the length of the array and c is the speed of light in the medium.

Assuming that the current output is proportional to the square of the intensity of the incident beam, provided the angles of incidence of the two light beams are made to be identical and of opposite signs then the current flow between the electrode pairs will represent a second order correlation of the light pulse. Subsequent reading of the stored charge from each electrode pair in sequence will enable a measure of the temporal profile of the pulse to be determined. In general, it is not necessary for the angles to be identical and of opposite signs provided that the two beams are not coincident so that they have an overlap which gives a temporal cross-section of the beam, for instance $\beta = 0$ and $\alpha \neq 0$. The resulting measurements then represent a convolution function of the light pulse.

Two possible arrangements for the measurement of the temporal profile of the light beam are schematically shown in FIGS. 8 and 9 in which like parts have like reference numerals. The light beam 71 from a laser 72 is initially spatially expanded in a beam expander 73 so that its cross-sectional profile is relatively uniform. Beam expander 73 may comprise a suitable combination of lenses or gratings. The expanded beam 74 is then directed to a beam splitter 75 where it is split in two components 61 and 62 which illuminate the array 53 of photoconductive elements at angles $\alpha$ and $\beta$ as shown with reference to FIGS. 7a and 7b. The time of travel of the two split beams 61 and 62 between beam splitter 75 and array 53 should be equal. One arrangement for ensuring this shown in FIG. 8 in which the path lengths of the two beams 61 and 62 are arranged to be equal by the use of two reflectors 76 and 77 in the paths of the two beams. The reflectors can be mirrors, prisms or the like. Alternatively where the lengths of the two paths of the beams 61 and 62 are not equal a delay element can be introduced in one of the paths to compensate for its shorter length. Such an arrangement is shown in FIG. 8 in which delay element 78 is introduced into the path 61 whereas path 62 is a longer path and includes a reflector 79. Element 78 may include means to modify the polarisation of the light beam in path 61. The medium in which the light travels can be air, vacuum, fibre optics or any other convenient light carrying medium.

A convenient way of adjusting the time resolution of the detector is by rotation of array 53 such that the angles and change as indicated schematically in FIG. 9. Alternatively other arrangements such as illumination of the array from either side of the semiconductor slab can also be used.

While the invention has been described in terms of the measurement of the characteristics of a light beam, the invention is not limited to the measurement of beams of electromagnetic radiation within the visible spectrum. By using suitable semiconductor mterial for layer 1 it is possible to measure beams of radiation of higher frequencies, for example X-rays or gamma rays. Additionally particle beams and ion beams or beams of other sub-atomic particles can be measured with suitable choice of material for the layer 1.

We claim:

1. Apparatus for measuring a characteristic of a beam of light comprising:

a layer of photosensitive semiconductor or insulating material and a plurality of electrodes on the layer, the electrodes being positioned to define a linear array of gaps between pairs of electrodes, one electrode of each pair being connected to a common input terminal and the other electrode of a pair bein connected to an individual output terminal, the material in the gaps acting as an array of light detectors;

means for directing a beam, a characteristic of which is to be measured onto said array;

means for detecting changes in an electrical characteristic of each of said detectors caused by incidence of the light beam of the said array, said detecting means comprising voltage bias means for applying a bias voltage to the common input terminal, individual resistors connected to the other electrode of each respective pair, individual pairs of back-to-back diodes connected to each resistor, a common voltage measuring means to which said pairs of diodes are connected so that the pairs of diodes block the voltages of the individual resistors from the voltage measuring means, and means for applying trigger pulses in sequence to each pair of diodes to enable any voltages across the resistors connected thereto to be measured in sequence; and means for indicating such changes.

2. Apparatus as claimed in claim 1 in which the said layer is a layer of semiconductor material.

3. Apparatus as claimed in claim 2 in which the said semiconductor material has an electrical characteristic which is substantially linearly related to the intensity of light incident thereon.

4. Apparatus as claimed in claim 3 in which the semiconductor material is near intrinsic crystalline silicon.

5. Apparatus as claimed in claim 1 in which means are provided for splitting the beam which is to be measured into two split beams and directing the two split beams on to the array with different angles of incidence so as to measure the temporal characteristics of the beam.

6. Apparatus as claimed in claim 5 in which the semiconductor material has an electrical characteristic which is non-linearly related to the intensity of the beam.

7. Apparatus as claimed in claim 6 in which the said material has a two photon conductivity.

8. Apparatus as claimed in claim 7 in which the semiconductor material comprises gallium phosphide or zinc phosphide.

9. Apparatus as claimed in claim 1 in which individual storage means are provided between the resistors and their associated pairs of diodes to store the peak voltages on the resistors until the application of a trigger pulse to the associated pair of diodes.

* * * * *